United States Patent
Chen et al.

(10) Patent No.: US 9,082,886 B2
(45) Date of Patent: Jul. 14, 2015

(54) ADDING DECOUPLING FUNCTION FOR TAP CELLS

(75) Inventors: Kuo-Ji Chen, Wu-Ku (TW); Li-Chun Tien, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 890 days.

(21) Appl. No.: 13/106,521

(22) Filed: May 12, 2011

(65) Prior Publication Data

US 2012/0286341 A1 Nov. 15, 2012

(51) Int. Cl.
*H01L 29/94* (2006.01)
*H01L 27/08* (2006.01)

(52) U.S. Cl.
CPC ............ *H01L 29/94* (2013.01); *H01L 27/0805* (2013.01); *H01L 27/0808* (2013.01)

(58) Field of Classification Search
CPC ....................................................... H01L 29/94
USPC .......................................... 257/300, E29.345
See application file for complete search history.

(56) References Cited

U.S. PATENT DOCUMENTS

| 6,560,753 | B2 | 5/2003 | Barney et al. |
| 7,473,623 | B2 * | 1/2009 | Chen et al. ................... 438/585 |
| 2002/0117720 | A1 * | 8/2002 | Lee et al. ...................... 257/369 |
| 2007/0045770 | A1 * | 3/2007 | Aoki .............................. 257/516 |
| 2007/0170553 | A1 * | 7/2007 | Correale et al. ............. 257/665 |
| 2008/0003789 | A1 | 1/2008 | Chen et al. |
| 2011/0198677 | A1 * | 8/2011 | Carlson ......................... 257/296 |

* cited by examiner

*Primary Examiner* — Mohammad Islam
*Assistant Examiner* — John P Dulka
(74) *Attorney, Agent, or Firm* — Slater & Matsil, L.L.P.

(57) ABSTRACT

A tap cell includes a well region and a well pickup region of the well region; a VDD power rail; and a VSS power rail. A MOS capacitor includes a gate electrode line acting as a first capacitor plate, and the well pickup region acting as a part of a second capacitor plate. A first one of the first and second capacitor plates is coupled to the VDD power rail, and a second one of the first and second capacitor plates is coupled to the VSS power rail.

20 Claims, 4 Drawing Sheets

Row 1: | 20/24 | 22 | 20/24 | ... | 20/24 | 22 | ... | 22 | 20/24 |

Row 2: | 22 | 20/24 | ... | 20/24 | 22 | ... | 20/24 | 22 | 20/24 |

Fig. 4

ADDING DECOUPLING FUNCTION FOR TAP CELLS

BACKGROUND

Tap cells are commonly used in the integrated circuit design. Tap cells provide the body bias of the transistors and have the function of preventing the undesirable latch-up of integrated circuits, which latch-up is resulted from parasitic bipolar transistors of integrated circuits. Through the tap cells, n-well regions are coupled to VDD power rails, and p-well regions or p-type substrates are coupled to VSS power rails, which are electrical ground. Coupling the well regions and substrate regions to the VDD power rails and VSS power rails, respectively, may result in a reduction in the substrate resistance, and the reduction in the undesirable positive feedback in the integrated circuit.

For process uniformity and device performance reasons, dummy gate electrodes (dummy polysilicon lines) were added in the tap cells. This causes the adverse increase in the chip area usage of the tap cells. Since the tap cells need to be placed with appropriate distances from each other, an integrated circuit may include many tap cells. The chip-area penalty caused by the dummy gate electrodes is thus high.

BRIEF DESCRIPTION OF THE DRAWINGS

For a more complete understanding of the embodiments, and the advantages thereof, reference is now made to the following descriptions taken in conjunction with the accompanying drawings, in which:

FIG. 4 schematically illustrates an integrated circuit comprising a plurality of rows of cells, in which tap cells are included.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A tap cell comprising decoupling capacitors is provided in accordance with an embodiment. The variations and the operation of the embodiment are then discussed. Throughout the various views and illustrative embodiments, like reference numbers are used to designate like elements.

Figure 1:
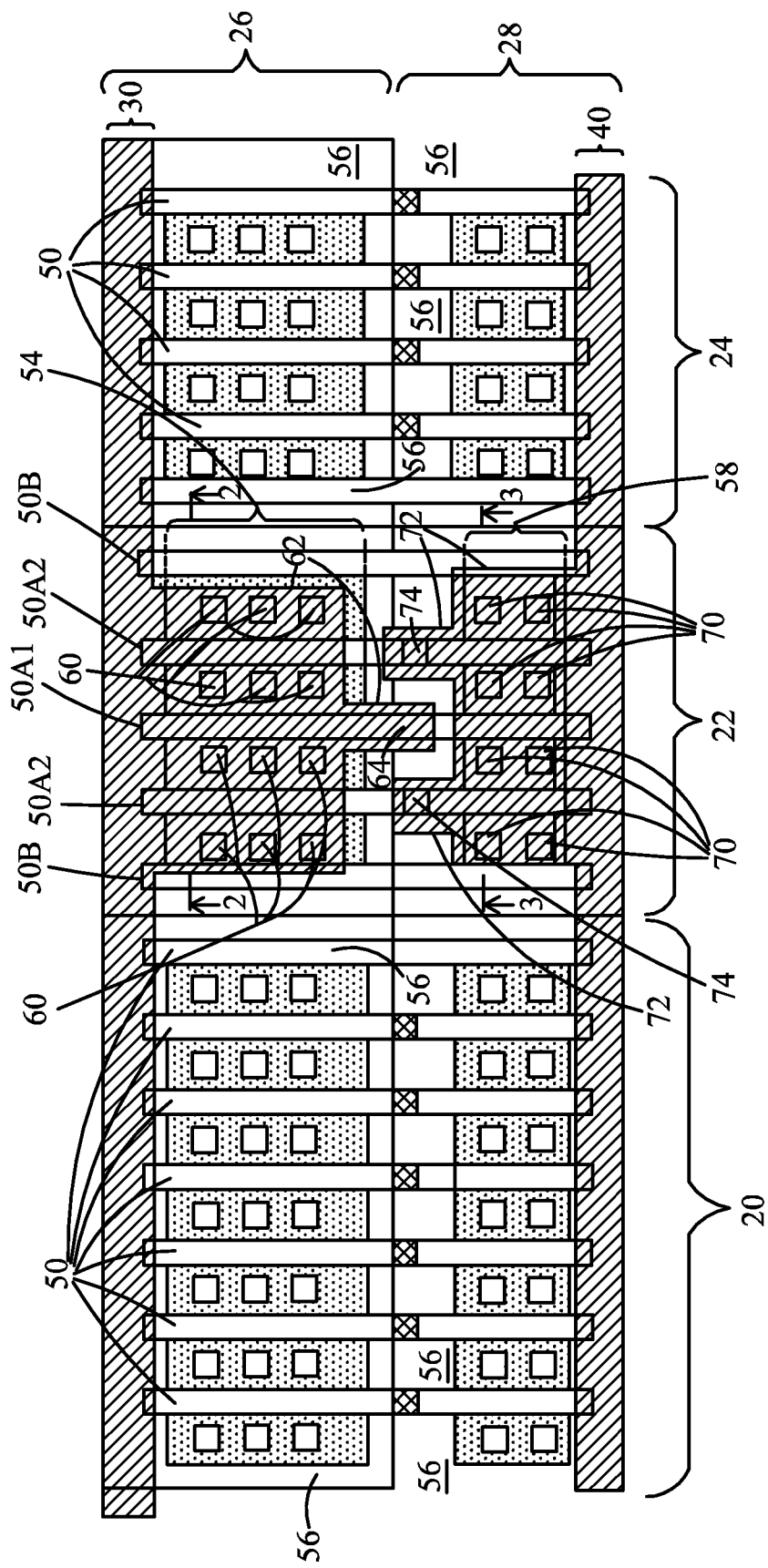
FIG. 1 illustrates a layout of an integrated circuit in accordance with an embodiment, wherein the integrated circuit includes a tap cell comprising decoupling capacitors.

FIG. 1 illustrates an exemplary layout of a part of an integrated circuit, wherein a part of a row of cells is illustrated. The row of cells includes cells 20, 22, and 24. Cells 20, 22, and 24 are standard cells that may be pre-built and saved in a design library, and are used for forming the illustrated integrated circuit through the steps of placement and route. Cells 20 and 24 represent any logic cells having logic functions, and may be inverter cells, NAND gate cells, multiplexers, and the like. Cell 22 is a tap cell, which is used for coupling n-well region 26 and p-well region (or p-substrate) 28 to VDD power rail 30 and VSS power rail 40, respectively. Each of VDD power rail 30 and VSS power rail 40 includes a part extending into each of tap cell 22 and cells 20 and 24. VDD power rail 30 and VSS power rail 40 may be located in a metal layer, which may be the bottom metal layer for example.

In an embodiment, the illustrated row includes n-well region 26 and p-well region (or p-substrate) 28. The row of cells includes a plurality of gate electrode lines 50 (including 50A1, 50A2, and 50B). Gate electrode lines 50 may be formed of polysilicon, and hence are alternatively referred to as POLY lines 50 throughout the description, although they may also be formed of other conductive materials such as metals, metal alloys, metal silicides, and the like. In an embodiment, all POLY lines 50 in tap cell 22 are parallel to each other and have a uniform pitch or non-uniform pitches. Furthermore, throughout the entire row, POLY lines 50 are parallel to each other, and may have a uniform pitch.

N-well pickup regions 54 are formed in n-well region 26, and may be surrounded by isolation regions 56, which may be shallow trench isolation regions in some embodiments. N-well pickup regions 54 are heavily doped with an n-type impurity such as phosphorous, arsenic, or the like. P-well pickup regions 58 are formed in p-well region 28, and may be surrounded by isolation regions 56. P-well pickup regions 58 are heavily doped with a p-type impurity such as boron, indium, or the like. In the described embodiments, the term "heavily doped" means an impurity concentration of above about $10^{19}/cm^3$. One skilled in the art will recognize, however, that "heavily doped" is a term of art that depends upon the specific device type, technology generation, minimum feature size, and the like. It is intended, therefore, that the term be interpreted in light of the technology being evaluated and not be limited to the described embodiments.

Contact plugs 60 electrically connect n-well pickup regions 54 to VDD power rail 30, for example, through metal jog(s) 62, which are the metal lines/pads that may be formed in the same metal layer as VDD power rail 30. Contact plugs 70 electrically connect p-well pickup regions 58 to VSS power rail 40, for example, through metal jog(s) 72, which may be formed in the same metal layer as VSS power rail 40. Furthermore, contact plug(s) 64 electrically connect POLY line(s) 50A1 to VDD power rail 30, for example, through metal jog 62, and contact plugs 74 electrically connect POLY lines 50A2 to VSS power rail 40, for example, through metal jogs 72.

Figure 2:
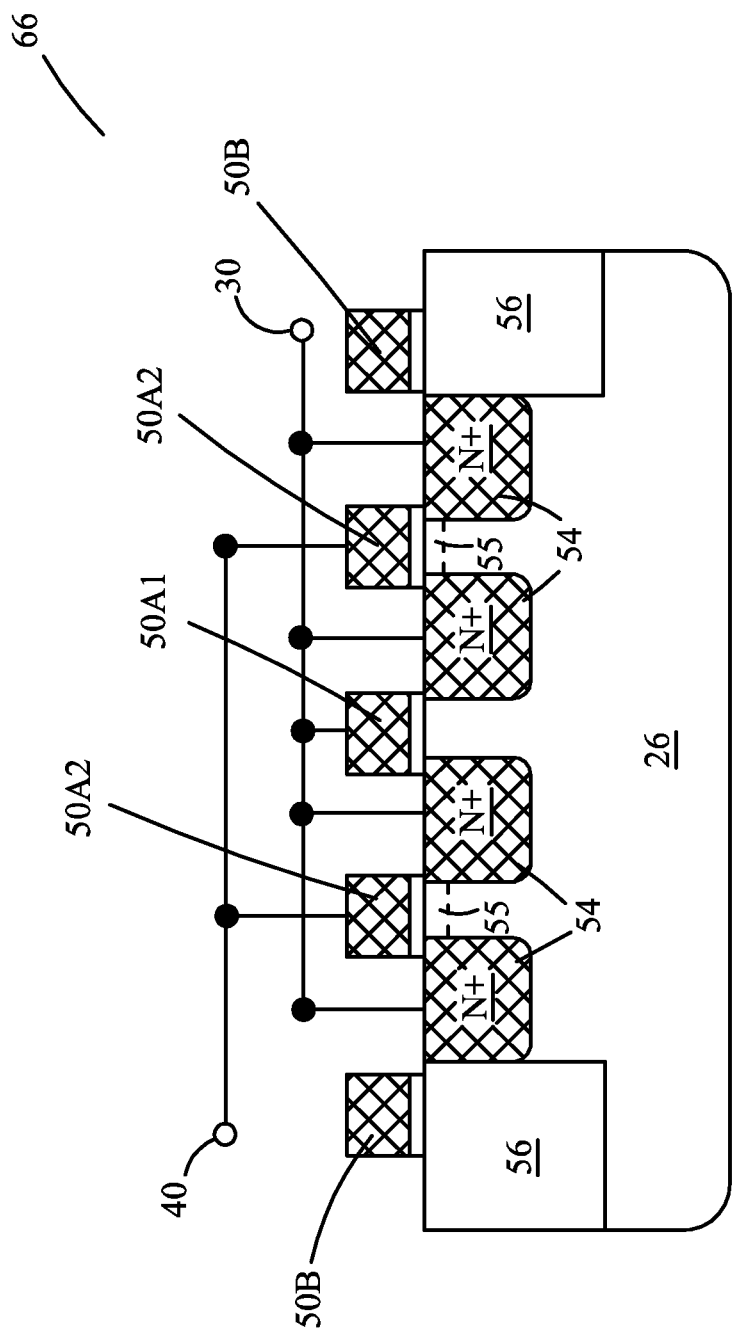
FIG. 2 illustrates a schematic cross-sectional view of the structure shown in FIG. 1, wherein the cross-sectional view comprises the decoupling capacitor formed of n-well pickup regions and the respective gate electrodes.

FIG. 2 illustrates a schematic cross-sectional view of a part of the structure shown in FIG. 1, wherein the cross-sectional view is obtained from the plane crossing line 2-2 in FIG. 1. N-well pickup regions 54 (N+) may be formed by implanting an n-type impurity into n-well region 26. Accordingly, N-well pickup regions 54 extend into n-well region 26. It is shown that gate electrode 50A1 is connected to n-well pickup regions 54. Furthermore, n-well pickup regions 54 are interconnected, and are connected to VDD power rail 30. Gate electrodes 50A2, however, are connected to VSS power line 40. Accordingly, decoupling MOS capacitor 66 is formed, wherein decoupling MOS capacitor may include a plurality of sub-capacitors connected in parallel. Each of gate electrodes 50A2 acts as one capacitor plate of one of the sub-capacitors. N-well pickup regions 54 and the channel regions 55 directly under gate electrodes 50A2 act as the other capacitor plates of the sub-capacitors.

Figure 3:
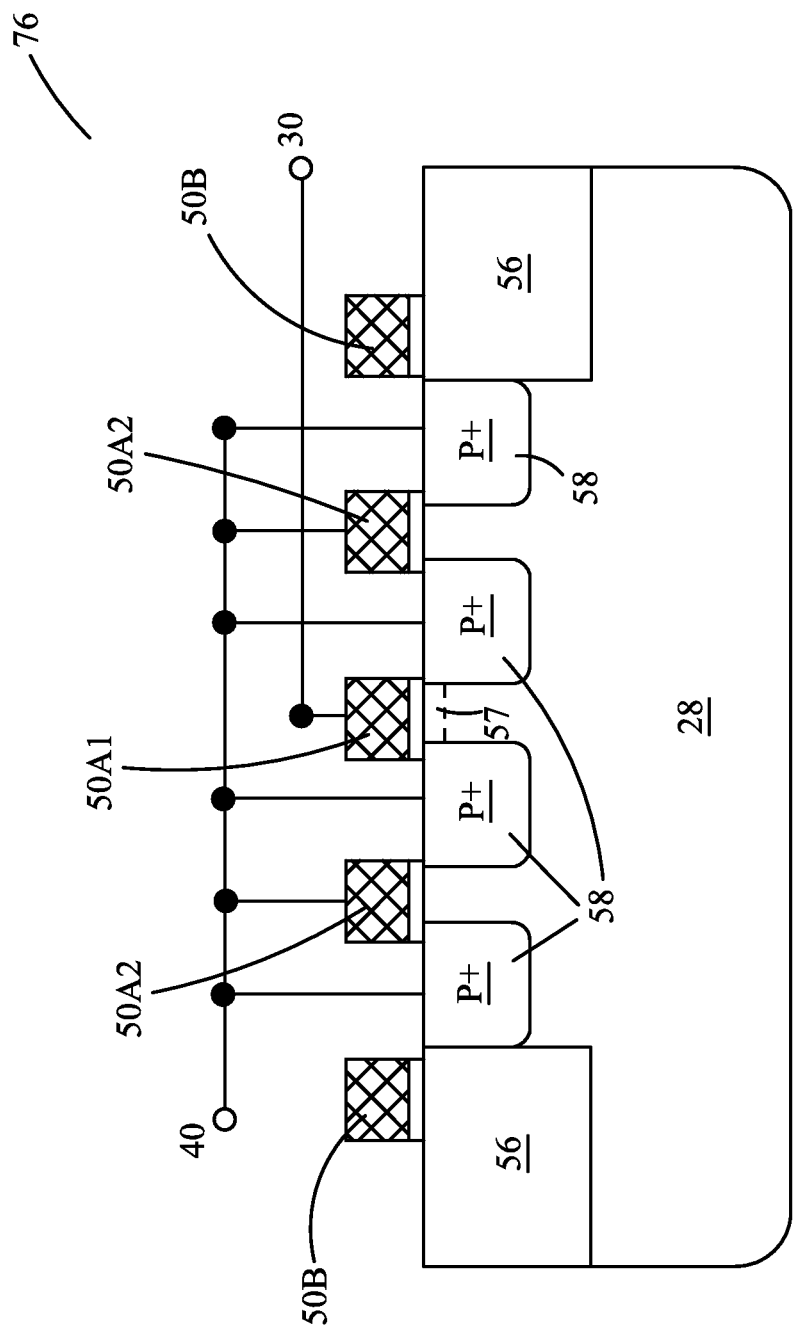
FIG. 3 illustrates a schematic cross-sectional view of the structure shown in FIG. 1, wherein the cross-sectional view comprises the decoupling capacitor formed of p-well pickup regions and the respective gate electrodes.

FIG. 3 illustrates a schematic cross-sectional view of a part of the structure shown in FIG. 1, wherein the cross-sectional view is obtained from the plane crossing line 3-3 in FIG. 1. P-well pickup regions 58 (P+) may be formed by implanting a p-type impurity into p-well region 28. Accordingly, p-well pickup regions 58 extend into p-well region 28. It is shown that gate electrode 50A1 is connected to VDD power rail 30. In some embodiments, there is a plurality of gate electrodes 50A1, and the plurality of gate electrodes 50A1 may be interconnected. P-well pickup regions 58 are interconnected, and p-well pickup regions 58 and gate electrodes 50A2 are connected to VSS power rail 40. Accordingly, decoupling MOS capacitor 76 is formed, wherein decoupling MOS capacitor 76 may include a plurality of sub-capacitors (although one is shown) connected in parallel. Each of gate electrodes 50A1 acts as one capacitor plate of each of the sub-capacitors. P-well pickup regions 58 and the respective channel region(s) 57 directly under gate electrode(s) 50A1 act as the other capacitor plates of the sub-capacitors.

Referring back to FIG. 1, in an embodiment, POLY lines 50B are dummy POLY lines, which are electrically floating. There may exist pickup regions 54 or 58 formed on one side, but not on the other side, of the respective dummy POLY lines 50B. POLY lines 50A1 and 50A2, which are connected to VDD power rail 30 and VSS power rail 40, respectively, may be placed in an alternating pattern such as a GPG pattern, with letter "G" representing POLY line 50A2, and letter "P" representing POLY line 50A1. In alternative embodiments, POLY lines 50A1 and 50A2 may be placed in any other patterns such as GGP, GPP, GPGPG, GGPPP, and the like. Furthermore, dummy POLY lines 50B may be inserted between any POLY lines 50A1 and 50A2 that are in tap cell 22. In an embodiment, as shown in FIG. 1, tap cell 22 may be free from other integrated circuit devices such as resistors and transistors that do not act as MOS capacitors.

FIG. 4 illustrates a plurality of cells placed as two rows, namely row 1 and row 2. Since tap cell 22 is a standard cell, an integrated circuit including a plurality of rows of cells may include a plurality of tap cells identical to cell 22. The integrated circuit may also include other tap cells that are different from the illustrated tap cell 22, but also include decoupling MOS capacitors similar to MOS capacitors 66 and 76 as shown in FIGS. 2 and 3, respectively. Furthermore, a row of cells may include a plurality of tap cells identical to cell 22. In an embodiment, tap cells 22 may form a column (or a row) in a circuit including a plurality of rows and/or columns of standard cells. Furthermore, the VDD power rails 30 of neighboring tap cells 22 may be combined, and the VSS power rails 40 of neighboring tap cells 22 may be combined. The edges of tap cells 22 in the same column may be aligned, wherein the edges are perpendicular to VDD power rails 30 and VSS power rail 40, although the edge may also be misaligned.

Referring again to FIG. 1, since tap 22 includes MOS capacitors including contact plugs connected to gate electrodes, and well pickup regions on opposite sides of the gate electrode, the environment of tap cell 22 is similar to that of logic cells 20 and 24. Accordingly, the uniformity of patterns is improved. Furthermore, in addition to the function of providing well coupling to VDD and VSS power rails, tap cell 22 also provides decoupling capacitors for power rails. Therefore, the chip area occupied by tap cell 22 is used efficiently.

In accordance with embodiments, a tap cell includes a well region and a well pickup region of the well region; a VDD power rail; and a VSS power rail. A MOS capacitor includes a gate electrode line acting as a first capacitor plate, and the well pickup region acting as a part of a second capacitor plate. A first one of the first and second capacitor plates is coupled to the VDD power rail, and a second one of the first and second capacitor plates is coupled to the VSS power rail.

In accordance with other embodiments, a tap cell includes an n-well region; a gate electrode over the n-well region; and well pickup regions of the n-well region on opposite sides of the first gate electrode. The first gate electrode and the well pickup regions form a first decoupling capacitor, with the first gate electrode connected to a VSS power rail, and the well pickup regions interconnected and connected to a VDD power rail.

In accordance with yet other embodiments, a tap cell includes a VDD power rail; a VSS power rail; and a first and a second decoupling capacitor. The first decoupling capacitor includes an n-well region; a first gate electrode extending over the n-well region and connected to the VSS power rail; and first well pickup regions on the n-well region and on opposite side of the first gate electrode, wherein the first well pickup regions are connected to the VDD power rail. The second decoupling capacitor includes a p-well region; a second gate electrode over the p-well region and connected to the VDD power rail; and second well pickup regions on the p-well region and on opposite side of the second gate electrode, wherein the second well pickup regions are connected to the VSS power rail.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A circuit comprising:
  a tap cell comprising:
    a well region;
    a first well pickup region of the well region;
    a VDD power rail comprising a first edge;
    a VSS power rail comprising a second edge parallel to the first edge of the VDD power rail;
    a first jog continuously connected to the VDD power rail and forming a continuous metal region with the VDD power rail, wherein the first jog extends more toward the VSS power rail than the first edge; and
    a first MOS capacitor comprising a first gate electrode line acting as a first capacitor plate, and the first well pickup region acting as a part of a second capacitor plate, wherein a first one of the first and second capacitor plates is overlapped by and connected to the first jog, and a second one of the first and second capacitor plates is coupled to the VSS power rail.

2. The circuit of claim 1, wherein the tap cell is free from any transistor that does not act as a MOS capacitor.

3. The circuit of claim 1, wherein the well region is an n-well region, and wherein the first gate electrode line is connected to the VSS power rail, and the first well pickup region is connected to the VDD power rail.

4. The circuit of claim 3, wherein the tap cell further comprises:
 a p-well region; and
 a second MOS capacitor, wherein a second gate electrode line and a second well pickup region of the p-well region act as capacitor plates of the second MOS capacitor, and wherein the capacitor plates of the second MOS capacitor are coupled to the VDD power rail and the VSS power rail.

5. The circuit of claim 1, wherein the well region is a p-well region, and wherein the first gate electrode line is connected to the VDD power rail, and the first well pickup region is connected to the VSS power rail.

6. The circuit of claim 1 further comprising:
 a second jog continuously connected to the VSS power rail and forming an additional continuous metal region with the VSS power rail, wherein the second jog extends more toward the VDD power rail than VSS power rail; and
 a second MOS capacitor comprising a second gate electrode line and a second well pickup region of the well region acting as capacitor plates, wherein one of the capacitor plates of the second MOS capacitor is overlapped by and connected to the second jog.

7. The circuit of claim 1, wherein the first MOS capacitor further comprises a second well pickup region of the well region, wherein the first and the second well pickup regions are on opposite sides of the first gate electrode line, and wherein the second well pick up region forms a further part of the second capacitor plate.

8. The circuit of claim 1, wherein the tap cell further comprises a dummy gate electrode line parallel to the first gate electrode line.

9. The circuit of claim 1 further comprising a plurality of tap cells identical to the tap cell.

10. The circuit of claim 9, wherein the plurality of tap cells and the tap cell are in a same row of cells.

11. A circuit comprising:
 a tap cell comprising:
  a VDD power rail;
  a VSS power rail;
  a first decoupling capacitor comprising:
   an n-well region;
   a first gate electrode extending over the n-well region and connected to the VSS power rail; and
   first well pickup regions of the n-well region and on opposite side of the first gate electrode, wherein the first well pickup regions are connected to the VDD power rail; and
  a second decoupling capacitor comprising:
   a p-well region;
   a second gate electrode over the p-well region and connected to the VDD power rail, wherein each of the first and the second gate electrodes comprises portions overlapped by both the VDD power rail and the VSS power rail; and
   second well pickup regions of the p-well region and on opposite side of the second gate electrode, wherein the second well pickup regions are connected to the VSS power rail.

12. The circuit of claim 11 further comprising:
 a first jog continuously connected to the VDD power rail and forming a continuous metal region with the VDD power rail, wherein the first jog extends more toward the VSS power rail than the VDD power rail, and overlaps both the first gate electrode and the second gate electrode; and
 a second jog continuously connected to the VSS power rail and forming an additional continuous metal region with the VSS power rail, wherein the second jog extends more toward the VDD power rail than the VSS power rail, and overlaps both the first gate electrode and the second gate electrode.

13. The circuit of claim 11 further comprising a plurality of tap cells identical to the tap cell, wherein the plurality of tap cells are in a same row of cells as the tap cell.

14. The circuit of claim 11, wherein in the tap cell, all well pickup regions directly over the n-well region are connected to the VDD power rail, all well pickup regions directly over the p-well region are connected to the VSS power rail, and wherein the tap cell further comprises a plurality of gate electrode lines parallel to each other, with the plurality of gate electrode lines connected to the VDD power rail and the VSS power rail in an alternating pattern.

15. A circuit comprising:
 a VDD power rail;
 a VSS power rail parallel to the VDD power rail;
 a first gate electrode forming a first capacitor plate of a first capacitor;
 an n-well pickup region forming a second capacitor plate of the first capacitor;
 a second plurality of gate electrodes parallel to the first gate electrode, wherein the first gate electrode is between two gate electrodes from the second plurality of gate electrodes, and wherein the second plurality of gate electrodes forms a first capacitor plate of a second capacitor;
 a p-well pickup region forming a second capacitor plate of the second capacitor;
 a first jog extending from the VDD power rail toward the VSS power rail, wherein the first jog overlaps the first gate electrode and the second plurality of gate electrodes;
 a second jog extending from the VSS power rail toward the VDD power rail, wherein the second jog overlaps the first gate electrode and the second plurality of gate electrodes;
 a first contact plug interconnecting the first jog and the first gate electrode; and
 a second plurality of contact plugs interconnecting the second jog and the second plurality of gate electrodes.

16. The circuit of claim 15, wherein the first jog and the VDD power rail are portions of a continuous metal region, with no interface between the first jog and the VDD power rail, and wherein the second jog and the VSS power rail are portions of a continuous metal region, with no interface between the second jog and the VSS power rail.

17. The circuit of claim 15 further comprising:
 an n-well region overlapped by the first jog, the first gate electrode, and the second plurality of gate electrodes; and
 a p-well region overlapped by the second jog, the first gate electrode, and the second plurality of gate electrodes.

18. The circuit of claim 17, wherein the first jog further comprises a portion overlapping the p-well region.

19. The circuit of claim 17, wherein the second jog does not overlap the n-well region.

20. The circuit of claim 15, wherein the first gate electrode overlaps the n-well pickup region and the p-well pickup region, and wherein the second plurality of gate electrodes overlaps the n-well pickup region and the p-well pickup region.

* * * * *